United States Patent
Kim et al.

(10) Patent No.: US 8,569,140 B2
(45) Date of Patent: Oct. 29, 2013

(54) METHOD OF FABRICATING SEMICONDUCTOR DEVICE

(75) Inventors: Kyu-Tae Kim, Yongin-si (KR);
Jong-Seo Hong, Yongin-si (KR);
Tae-Han Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 268 days.

(21) Appl. No.: 13/194,030

(22) Filed: Jul. 29, 2011

(65) Prior Publication Data
US 2012/0052647 A1    Mar. 1, 2012

(30) Foreign Application Priority Data
Aug. 27, 2010 (KR) .................. 10-2010-0083514

(51) Int. Cl.
*H01L 21/336* (2006.01)

(52) U.S. Cl.
USPC .... 438/300; 438/183; 438/592; 257/E21.444; 257/E21.453

(58) Field of Classification Search
USPC ......... 438/183, 197, 229, 230, 287, 299, 300, 438/591, 592; 257/E21.444, E21.453
See application file for complete search history.

(56) References Cited

U.S. PATENT DOCUMENTS

| | | | | |
|---|---|---|---|---|
| 6,054,355 A * | 4/2000 | Inumiya et al. | ................ | 438/296 |
| 6,492,214 B2 * | 12/2002 | Chen et al. | .................... | 438/183 |
| 6,812,535 B2 | 11/2004 | Yagishita et al. | | |
| 6,849,511 B2 * | 2/2005 | Iriyama et al. | ................ | 438/275 |
| 7,268,065 B2 * | 9/2007 | Lin et al. | ........................ | 438/510 |
| 7,517,746 B2 * | 4/2009 | Lin et al. | ........................ | 438/197 |
| 7,745,889 B2 * | 6/2010 | Lin et al. | ........................ | 257/412 |
| 8,039,381 B2 * | 10/2011 | Yeh et al. | ........................ | 438/595 |
| 8,048,792 B2 * | 11/2011 | Beyer et al. | ....................... | 438/595 |
| 8,138,038 B2 * | 3/2012 | Heinrich et al. | ............... | 438/199 |
| 8,309,411 B2 * | 11/2012 | Na et al. | ........................ | 438/229 |
| 2008/0265322 A1 * | 10/2008 | Lin et al. | ........................ | 257/347 |
| 2010/0044783 A1 * | 2/2010 | Chuang et al. | ................. | 257/328 |
| 2010/0065926 A1 * | 3/2010 | Yeh et al. | ........................ | 257/410 |
| 2010/0240178 A1 * | 9/2010 | Shin | ............................. | 438/230 |
| 2011/0147858 A1 * | 6/2011 | Lim et al. | ....................... | 257/412 |
| 2011/0248359 A1 * | 10/2011 | Hwang et al. | .................. | 257/410 |
| 2012/0074475 A1 * | 3/2012 | Chew et al. | ....................... | 257/295 |
| 2012/0088359 A1 * | 4/2012 | Kim et al. | ....................... | 438/589 |
| 2012/0193710 A1 * | 8/2012 | Cheng et al. | .................. | 257/337 |
| 2012/0248509 A1 * | 10/2012 | Guo et al. | ....................... | 257/288 |
| 2012/0322218 A1 * | 12/2012 | Lai et al. | ....................... | 438/303 |

FOREIGN PATENT DOCUMENTS

| | | |
|---|---|---|
| JP | 2005019892 A | 1/2005 |
| JP | 2007134432 A | 5/2007 |

* cited by examiner

*Primary Examiner* — Matthew C. Landau
*Assistant Examiner* — Joseph C Nicely
(74) *Attorney, Agent, or Firm* — Harness, Dickey & Pierce, P.L.C.

(57) ABSTRACT

A method for fabricating a semiconductor device is disclosed. One embodiment of the method includes forming a dummy gate pattern on a substrate, forming an interlayer dielectric film that covers the dummy gate pattern, exposing a top surface of the dummy gate pattern, selectively removing the dummy gate pattern to form a first gate trench, forming a sacrificial layer pattern over a top surface of the substrate in the first gate trench, the sacrificial layer pattern leaving a top portion of the first gate trench exposed, increasing an upper width of the exposed top portion of the first gate trench to form a second gate trench, and removing the sacrificial layer pattern in the second gate trench, and forming a non-dummy gate pattern in the second gate trench.

19 Claims, 12 Drawing Sheets

METHOD OF FABRICATING SEMICONDUCTOR DEVICE

CROSS-REFERENCE TO RELATED APPLICATION

This application claims priority from Korean Patent Application No. 10-2010-0083514 filed on Aug. 27, 2010 in the Korean Intellectual Property Office, and all the benefits accruing therefrom under 35 U.S.C. 119, the contents of which in its entirety are herein incorporated by reference.

BACKGROUND OF THE INVENTION

1. Field

Example embodiments relate to a method of fabricating a semiconductor device.

2. Description of the Related Art

Owing to various advantages including small size, multiple functions, low manufacturing cost, and so on, semiconductor devices have been drawing attentions as important factors in the electronic industry. A semiconductor device may be divided into a storage device that stores logic data, and a logic device that processes operations of logic data.

With the trend toward small-sized logic devices, highly integrated logic device are increasingly in demand. However, high integration of the logic device may involve several problems that do not occur in the related art, and solutions to these problems are being researched.

SUMMARY OF THE INVENTION

Example embodiments relate to a method of fabricating a semiconductor device, which can easily fill a gate forming trench with a metal.

According to an example embodiment, there is provided a method of fabricating a semiconductor device, the method including forming a dummy gate pattern on a substrate, forming an interlayer dielectric film covering the dummy gate pattern, exposing a top surface of the dummy gate pattern, selectively removing the dummy gate pattern to form a first gate trench, forming a sacrificial layer pattern over a top surface of the substrate in the first gate trench, the sacrificial layer pattern leaving a top portion of the first gate trench exposed, increasing an upper width of the exposed top portion of the first gate trench to form a second gate trench, removing the sacrificial layer pattern in the second gate trench, and forming a non-dummy gate pattern in the second gate trench.

Another example embodiment, relates to a method of fabricating a semiconductor device, the method including forming a dummy gate pattern on a substrate, forming an interlayer dielectric film that covers the dummy gate pattern, forming a first gate forming trench in the interlayer dielectric film by selectively removing the dummy gate pattern, the first gate trench defining inner walls, forming a sacrificial layer pattern on a top surface of the substrate in the first gate trench while exposing a top portion of the first gate trench, the sacrificial layer pattern does not contact a portion of the inner walls of the first gate trench, forming a second gate trench by etching the portion of the inner wall of the first gate trench that does not contact the sacrificial layer pattern, the second gate trench (1) having a topmost width greater than a bottommost width and (2) defining an inner wall that includes (i) a portion not in contact with the sacrificial layer pattern and (ii) a portion in contact with the sacrificial layer pattern, removing the sacrificial layer pattern in the second gate trench, and forming a non-dummy gate pattern in the second gate trench.

Another example embodiment relates to a method of fabricating a semiconductor device, the method including forming a dielectric layer above a substrate; forming a first gate trench in the dielectric layer, the first gate trench having sidewalls; forming a sacrificial pattern layer in the first gate trench, the sacrificial pattern layer having an upper surface that is below an upper surface of the dielectric layer; increasing a width of at least a portion of the first gate trench to form a second gate trench, such that a width of at least a portion of second gate trench decreases from the upper surface of the dielectric layer removing the sacrificial pattern layer; and forming a first gate metal film in the second gate trench.

BRIEF DESCRIPTION OF THE DRAWINGS

Example embodiments will be more clearly understood from the following brief description taken in conjunction with the accompanying drawings. FIGS. 1-24 represent non-limiting example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Detailed Description

Example embodiments will now be described more fully with reference to the accompanying drawings, in which example embodiments are shown. Example embodiments, may, however, be embodied in many different forms and should not be construed as being limited to the embodiments set forth herein; rather, these embodiments are provided so that this disclosure will be thorough and complete, and will fully convey the concept of the example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

The terminology used herein is for the purpose of describing particular embodiments only and is not intended to be limiting. As used herein, the singular forms "a", "an" and "the" are intended to include, the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1 to 12 are cross-sectional views sequentially illustrating a method of fabricating a semiconductor device according to an example embodiment.

Figure 1:
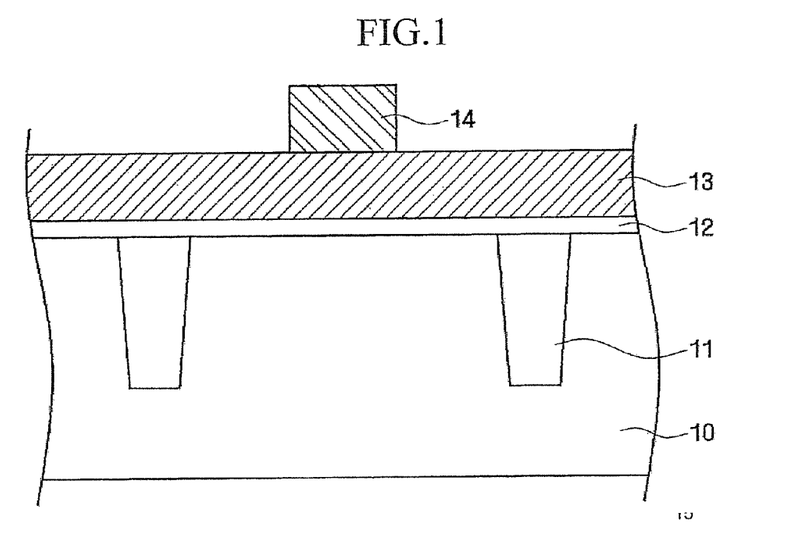
FIGS. 1 to 12 are cross-sectional views sequentially illustrating a method of fabricating a semiconductor device according to an example embodiment.

Referring to FIG. 1, a device isolation region 11 is formed in a substrate 10 to define an active region. The substrate 10 may be a rigid substrate such as a silicon substrate, a silicon on insulator (SOI) substrate, a gallium arsenic substrate, a silicon germanium substrate, a ceramic substrate, a quartz substrate, or a glass substrate for display, or a flexible plastic substrate made of polyimide, polyethylene terephthalate (PET), polyethylene naphthalate (PEN), polymethyl methacrylate (PMMA), polycarbonate (PC), polyester sulfone (PES), or polyester; however, selection of the substrate material is not limited to these materials.

The device isolation region 11 may be formed using field oxide (FOX) using Local Oxidation of Silicon (LOCOS) technique, or shallow trench isolation (STI). Next, an ion implantation process may be performed to form a well and a channel.

A dummy gate insulation layer 12 is formed on the substrate 10 having the device isolation region 11. The dummy gate insulation layer 12 may be made of silicon oxide, but not limited thereto. The dummy gate insulation layer 12 may be formed by thermal oxidation or chemical vapor deposition (CVD). A dummy gate layer 13 for forming gate patterns may be formed on the dummy gate insulation layer 12. The dummy gate layer 13 may be made of polysilicon, but not limited thereto. Next, photoresist is coated on the dummy gate layer 13 and a photoresist pattern 14 is formed by performing a photolithography process.

Figure 2:
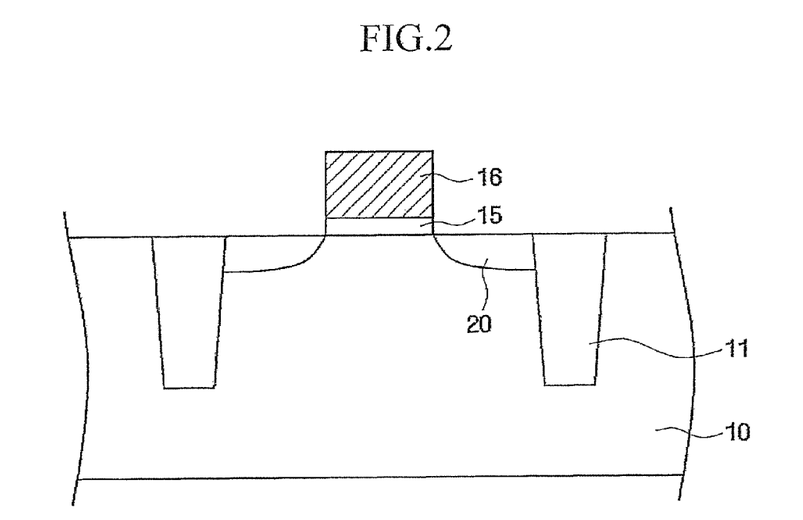

Referring to FIG. 2, the dummy gate insulation layer 12 and the dummy gate layer 13 are etched using the photoresist pattern 14 as an etch mask to form a dummy gate insulation layer pattern 15 and a dummy gate pattern 16. After forming the dummy gate pattern 16, the photoresist pattern 14 may be removed by an ashing process and/or a stripping process.

Next, impurity ions are implanted into the substrate 10 having the dummy gate pattern 16 to form a lightly doped source/drain region 20. In consideration of the length by which the lightly doped source/drain region 20 is diffused into a lower region of the dummy gate pattern 16 in subsequent processes, the impurity ion implantation process may be performed to form the lightly doped source/drain region 20 at opposite ends of a gate pattern to be finally formed.

Figure 3:
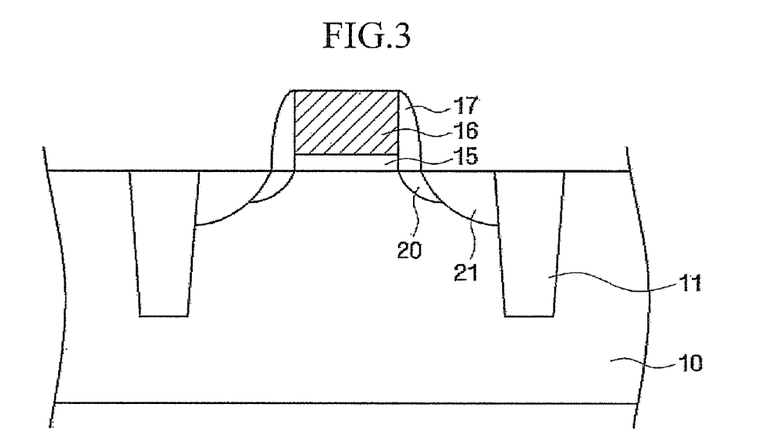

Referring to FIG. 3, a spacer forming insulation layer is formed along the profile of the substrate 10 having the dummy gate pattern 16, and is anisotrophically etched to form a spacer 17 on sidewalls of the dummy gate pattern 16 and the dummy gate insulation layer pattern 15. The spacer 17 may be made of a material having high etching selectivity to the dummy gate pattern 16, for example, silicon nitride, but the spacer 17 material is not limited thereto.

Next, impurity ion implantation is performed using the dummy gate pattern 16 and spacer 17 as masks to form a heavily source/drain region 21. In an example embodiment, a gate pattern 16 (refer to FIG. 4) may be formed after fowling the source/drain regions 20 and 21. This is because a temperature in a diffusing process for forming the source/drain regions 20 and 21 may be higher than a melting point of a metal for use in the gate pattern 16.

Figure 4:
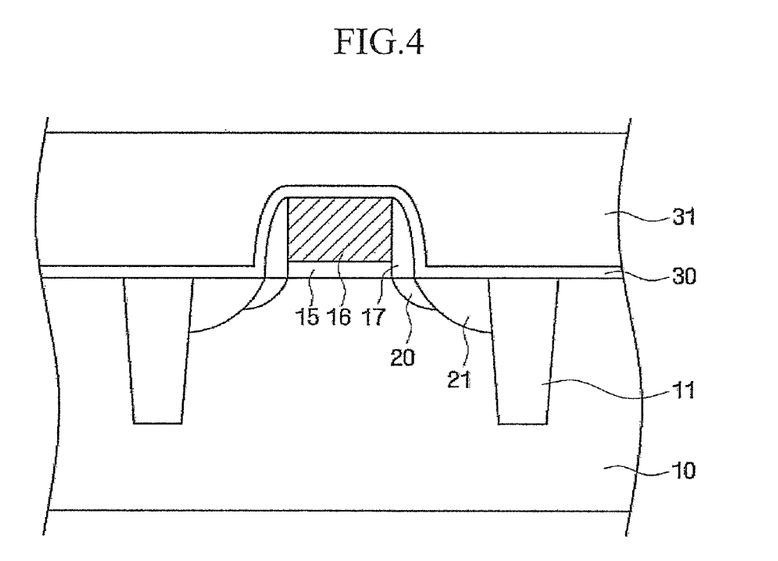

Referring to FIG. 4, an etch stopper film 30 is formed on the surface of the substrate 10 having the dummy gate insulation layer pattern 15, the dummy gate pattern 16 and the spacer 17. The etch stopper film 30 may be made of a material having high etching selectivity to the dummy gate pattern 16, for example, silicon nitride. While the example embodiment shown in FIG. 4 discusses silicon nitride as the etch stopper film 30, the material for the etch stopper film 30 is not limited thereto.

The etch stopper film 30 is provided as a film for preventing a contact hole connected to the heavily source/drain region 21 from being etched in a subsequent wiring process. The etch stopper film 30 allows the etching process to be performed to expose the heavily source/drain region 21, thereby forming the contact hole while reducing a recess of the substrate 10 corresponding to the source/drain region 21. However, forming the etch stopper film 30 may be omitted to simplify the process. For example, forming the etch stopper film 30 may be omitted in a case where the processing margin is controllable to stop the etching process at a portion where the top surface of the substrate 10 is because the contact hole connected to the heavily source/drain region 21 is not deep but a junction of the heavily source/drain region 21 is deep.

Next, an interlayer dielectric film 31 covering the dummy gate pattern 16 is formed on the etch stopper film 30. The interlayer dielectric film 31 may be formed of silicon oxide layer using chemical vapor deposition (CVD) or plasma enhanced chemical vapor deposition (PECVD) The interlayer dielectric film 31 may be formed of, for example, a high density plasma (HDP) oxide layer While the example embodiment in FIG. 4B discusses silicon oxide as the material for the interlayer dielectric film 31, example embodiments are not limited thereto. The interlayer dielectric film 31 is formed without a step difference from the top surface of dummy gate pattern 16 through a subsequent planarizing process. Thus, the top surface of the interlayer dielectric film 31 is higher than the top surfaces of the dummy gate pattern 16 or the etch stopper film 30.

Figure 5:
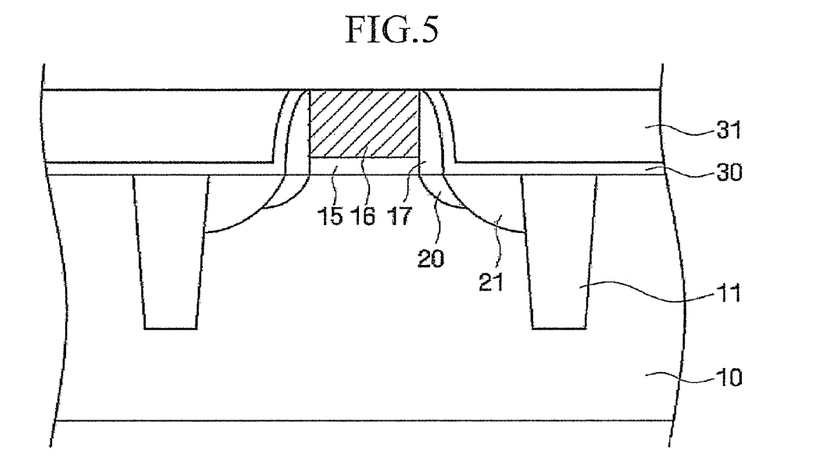

Referring to FIG. 5, a planarizing process is performed until the top surface of the dummy gate pattern 16 is exposed. The planarizing process may include, for example, a chemical mechanical polishing process, an etch-back process, and so on.

Figure 6:
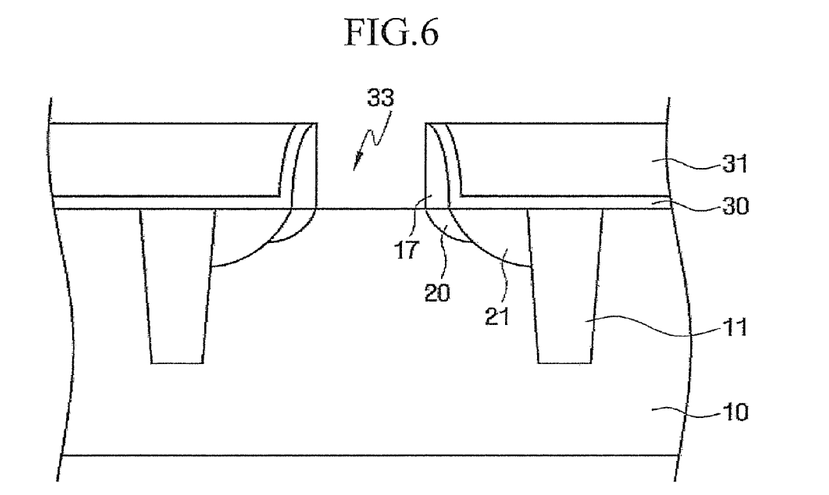

Referring to FIG. 6, a first gate forming trench 33 is formed by selectively removing the dummy gate pattern 16 and the dummy gate insulation layer pattern 15. The selective removal of the dummy gate pattern 16 and the dummy gate insulation layer pattern 15 allows the exposure of the top surface of the substrate 10. The dummy gate pattern 16 and the dummy gate insulation layer pattern 15 may be removed by reactive ion etching, but example embodiments are not limited thereto. According to an alternative embodiment, the dummy gate insulation pattern 15 is not removed when the dummy gate pattern 16 is removed.

Figure 7:
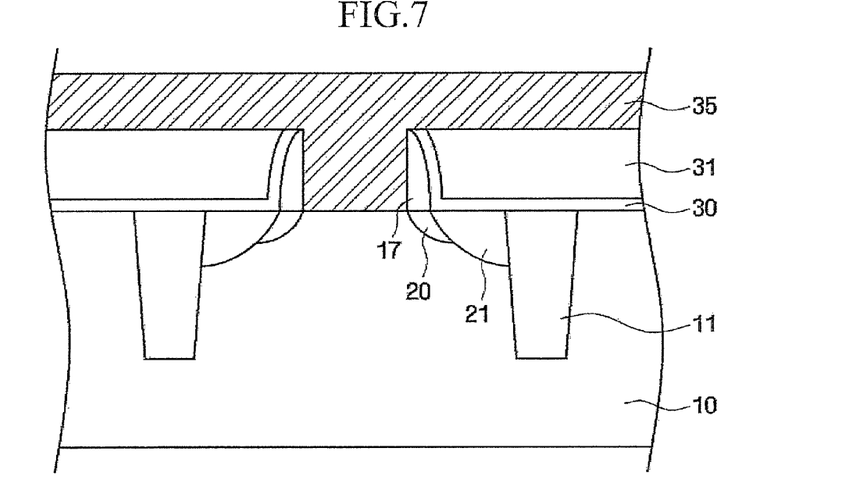

Referring to FIG. 7, a sacrificial layer 35 filling the first gate forming trench 33 is formed. The sacrificial layer 35 is formed to a thickness enough to cover the interlayer dielectric film 31 while filling the first gate forming trench 33. The sacrificial layer 35 may be made of a material having high etching selectivity to the interlayer dielectric film 31. For example, the sacrificial layer 35 may be formed of an organic layer or an oxide layer. The organic layer used in forming the sacrificial layer 35 may be a spin on hard mask (SOH), but example embodiments are not limited thereto. Usable examples of the oxide layer used in forming the sacrificial layer 35 may include a tonen silazene (TOSZ) layer, a spin on glass (SOG) layer, a flowable-chemical vapor deposition (F-CVD) layer, an undoped silica glass (USG) layer, but example embodiments are not limited thereto.

Figure 8:
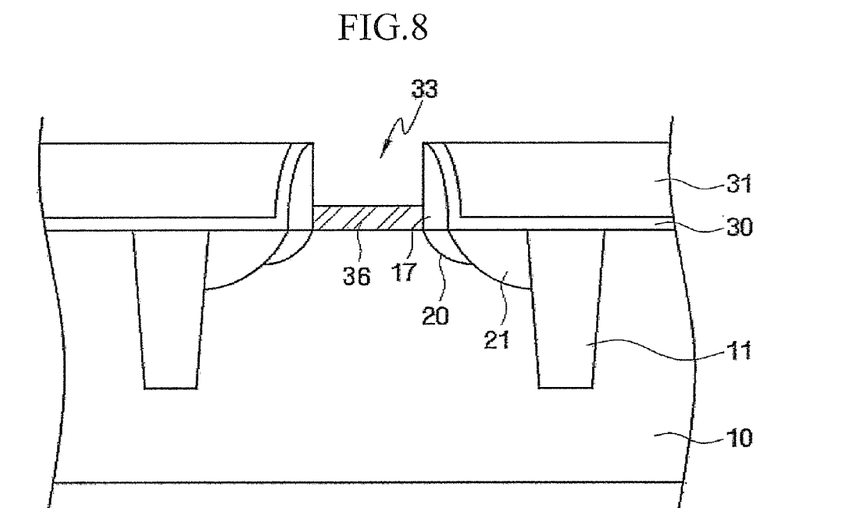

Referring to FIG. 8, a sacrificial layer pattern 36 exposing a top portion of the first gate forming trench 33 is formed by etching a portion of the sacrificial layer 35. The etching of the portion of the sacrificial layer 35 may be performed using an etch-back process The sacrificial layer 35 is etched such that the top surface of the sacrificial layer pattern 36 etched by the etch-back process is lower than top surfaces of the spacer 17, the etch stopper film 30 and the interlayer dielectric film 31. The height of the top surface of the sacrificial layer pattern 36 is preferably positioned to be closer to the substrate 10 as long as the top surface of the sacrificial layer pattern 36 is high enough to protect a region of the substrate 10 having a channel formed while a process for extending (or increasing) the top portion of the first gate forming trench 33 shown in FIG. 9 is performed.

Figure 9:
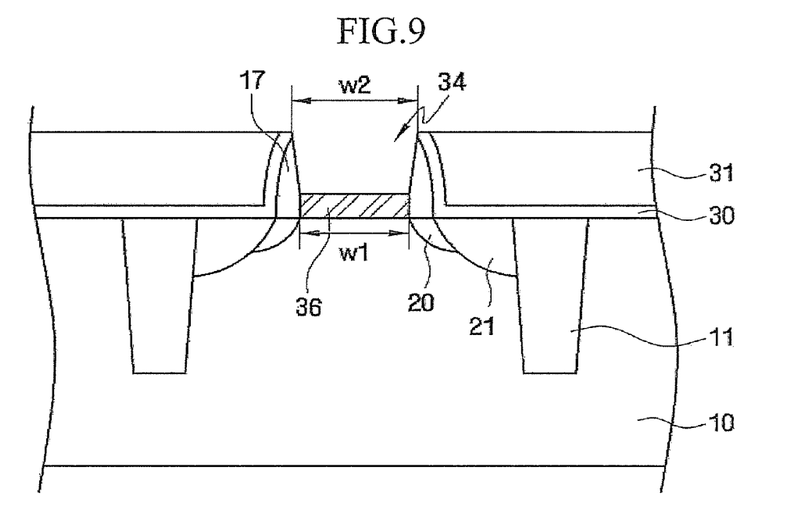

Referring to FIG. 9, a second gate forming trench 34 is formed by extending (or increasing) a width of the top portion of the first gate farming trench 33 using an etching process. The extending (or increasing) of the width of the top portion of the first gate forming trench 33 may be performed by dry etching or wet etching. The sidewall of the second gate aiming trench 34 having an extended top portion may have a sloping profile from the topmost portion to a portion where the sacrificial layer pattern 36 is formed. A width w2 of the topmost portion of the second gate forming trench 34 is greater than a width w1 of the bottommost portion of the second gate forming trench 34. The width of the first gate forming trench 33 is extended, starting from the width at a desired (or alternatively predetermined) height above the top surface of the sacrificial layer pattern 36 to the width at the top portion of the first gate forming trench 33, thereby easily controlling the portion of the second gate forming trench 34 where the width thereof starts to extend, and protecting a region in which the channel is to be formed in the substrate 10.

Figure 10:
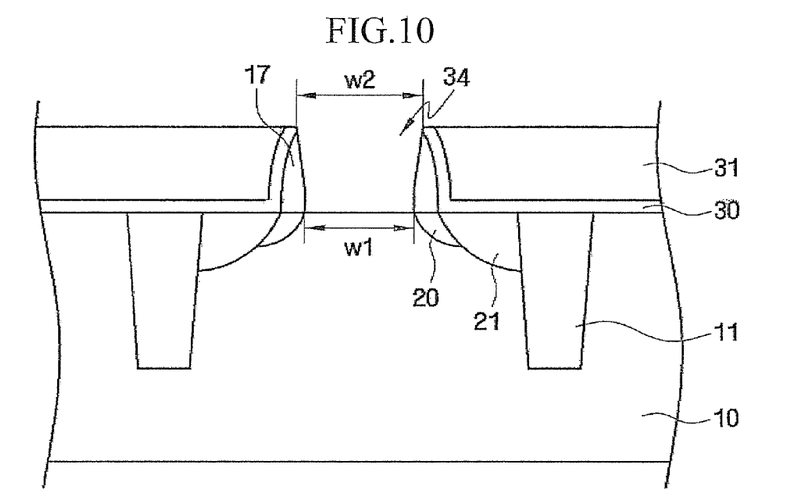

Referring to FIG. 10, the sacrificial layer pattern 36 remaining in the second gate forming trench 34 is removed. The sacrificial layer pattern 36 may be removed by a general ashing process and/or a general stripping process, but example embodiments are not limited thereto. The sidewall of the second gate forming trench 34 may have a vertical profile to a desired (or alternatively predetermined) height from the bottommost portion of the second gate forming trench 34 and may have a sloping profile in which the width of the second gate forming trench 34 upwardly increases from the desired (or alternatively predetermined) height to the topmost portion of the second gate forming trench 34.

Figure 11:
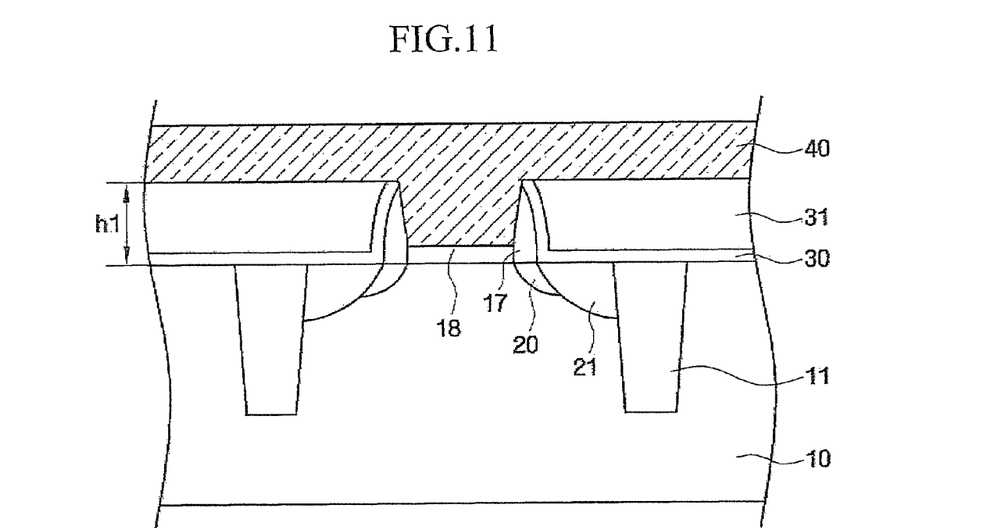

Referring to FIG. 11, a gate insulation layer 18 is formed in the second gate forming trench 34. The gate insulation layer 18 may be formed of, for example, a silicon oxide layer, a silicon nitride layer, or a highly dielectric insulation film, but example embodiments are not limited thereto. Next, a gate forming metal film 40 is formed in the second gate forming trench 34 having the gate insulation layer 18 to fill the second gate forming trench 34 with a metal. The gate forming metal film 40 may be made of aluminum (Al), tungsten (W), or molybdenum (Mo), but example embodiments are not limited thereto. The gate forming metal film 40 may be formed by physical vapor deposition (PVD), sputtering, or chemical vapor deposition (CVD), but example embodiments are not limited thereto. The gate forming metal film 40 may also be formed on the interlayer dielectric film 31 while filling the second gate forming trench 34.

As shown in FIG. 6, in a case where the sidewall of the first gate forming trench 33 has a vertical profile, it may be difficult to fill the first gate forming trench 33 with a metal for forming a gate. However, as shown in FIG. 11, in a case where the sidewall of the first gate forming trench 33 has a sloping profile in which the second gate forming trench 34 has an upper width greater than a lower width, it is easy to fill the second gate forming trench 34 with the gate forming metal film 40.

Figure 12:
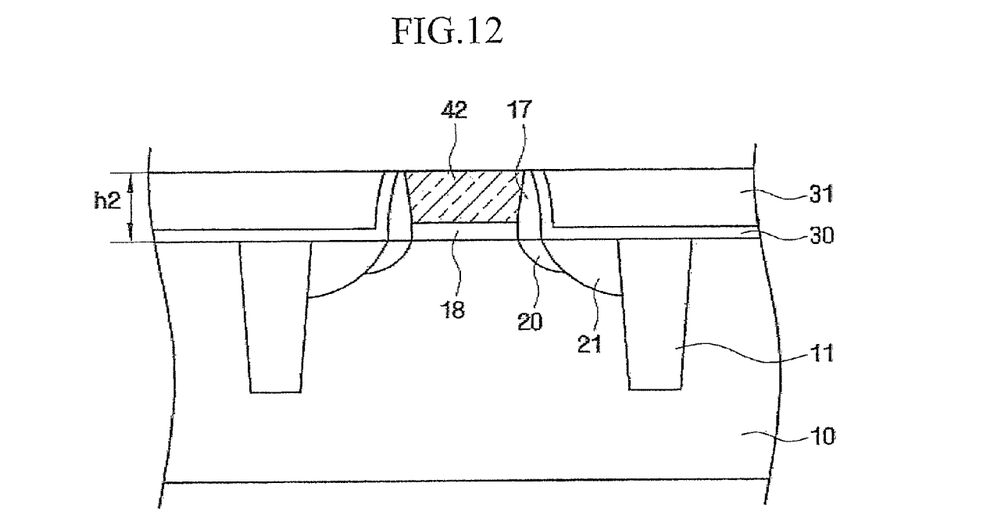

Referring to FIG. 12, the gate forming metal film 40 formed on the interlayer dielectric film 31 is removed, followed by performing the planarizing process to reduce the height of the second gate forming trench 34. Referring to FIGS. 11 and 12, the height of the second gate forming trench 34 before the planarizing process is h1, and the height of the second gate forming trench 34 after the planarizing process is h2. Here, the planarizing process may be performed such that h2 is smaller than h1. The upper width of the gate pattern 42 formed in the second gate forming trench 34 becomes increased by extending (or increasing) the upper portion of the second gate forming trench 34. In this case, a short margin with the contact plug formed corresponding to the heavily doped source/drain region 21 may be reduced. Thus, the height of the second gate forming trench 34 is reduced through the planarizing process, thereby maintaining the short margin with the contact plug formed corresponding to the heavily doped source/drain region 21 at a constant level. Thereby, the gate pattern 42 is formed in the second gate forming trench 34.

Figure 13:
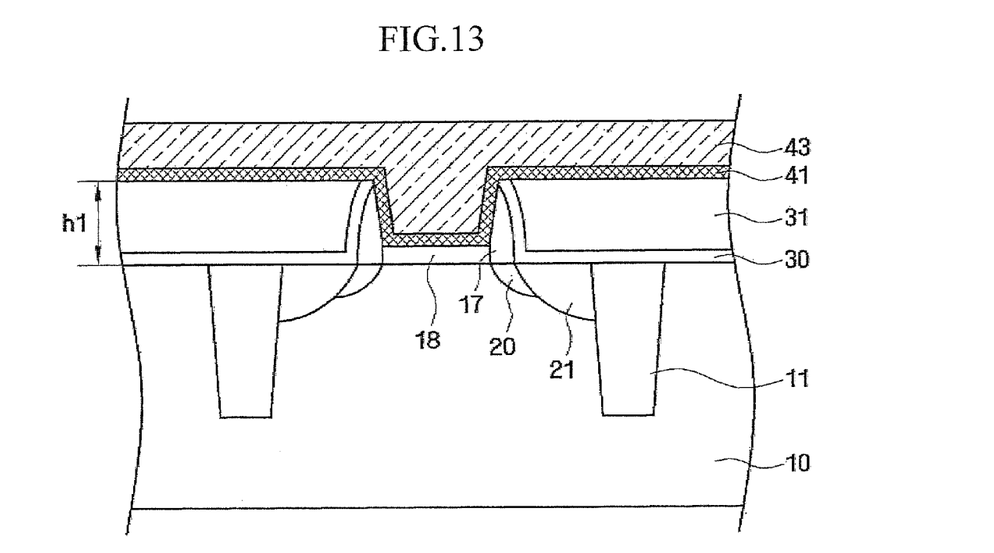
FIGS. 13 and 14 are cross-sectional views illustrating a method of fabricating a semiconductor device according to an example embodiment.
Figure 14:
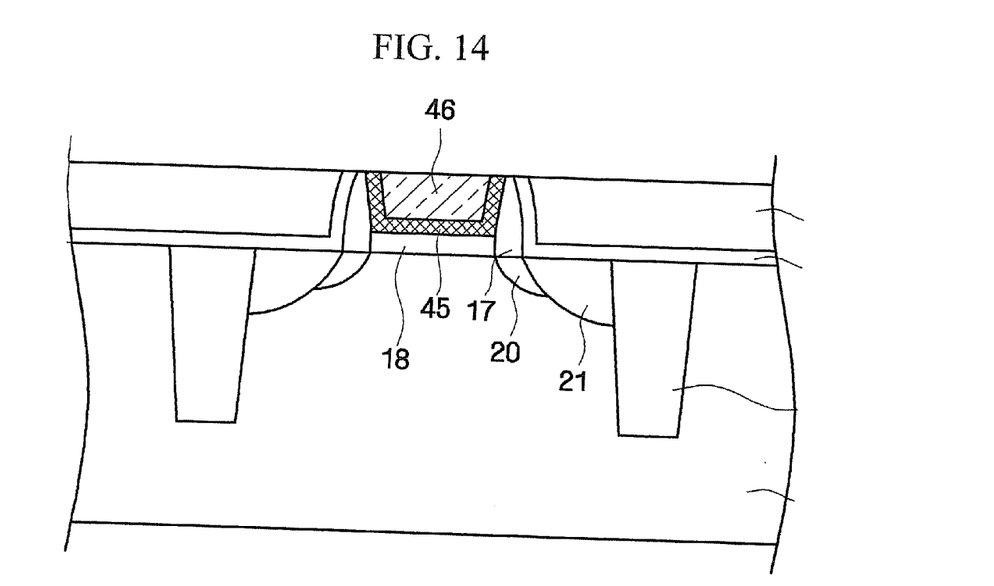

A method of fabricating a semiconductor device according to another example embodiment will now be described with reference to FIGS. 13 and 14. FIGS. 13 and 14 are cross-sectional views illustrating a method of fabricating a semiconductor device according to another example embodiment. Here, the features the same as those of FIGS. 1 to 12 are denoted by the same reference numerals, and a detailed description thereof will be omitted.

Referring to FIG. 13, the method of fabricating a semiconductor device according to an example embodiment is different from the method according to the previous example embodiment in that the gate forming metal film that fills the second gate forming trench 34 is formed as a first sub gate forming metal film 41 and a second sub gate forming metal film 43. The first sub gate forming metal film 41 may be formed of a titanium nitride film or a tantalum nitride film but example embodiments are not limited thereto In addition, the second sub gate forming metal film 43 may be made of aluminum (Al), tungsten (W), or molybdenum (Mo), but example embodiments are not limited thereto.

Referring to FIG. 14, the first sub gate forming metal film 41 and the second sub gate forming metal film 43 formed on the interlayer dielectric film 31 are removed, followed by performing the planarizing process to reduce the height of the second gate forming trench 34, as shown in FIG. 12. Referring to FIGS. 13 and 14, the height h2 of the second gate forming trench 34 after the planarizing process is smaller than the height h1 of the second gate forming trench 34 before the planarizing process. Accordingly, the gate pattern, referring to the first sub gate pattern 45 and the second sub gate pattern 46, is formed in the second gate forming trench 34.

FIGS. 15 to 23 are cross-sectional views illustrating a method of fabricating a semiconductor device according to another example embodiment. Here, the features the same as those of FIGS. 1 to 14 are denoted by the same reference numerals, and a detailed description thereof will be omitted.

Figure 15:
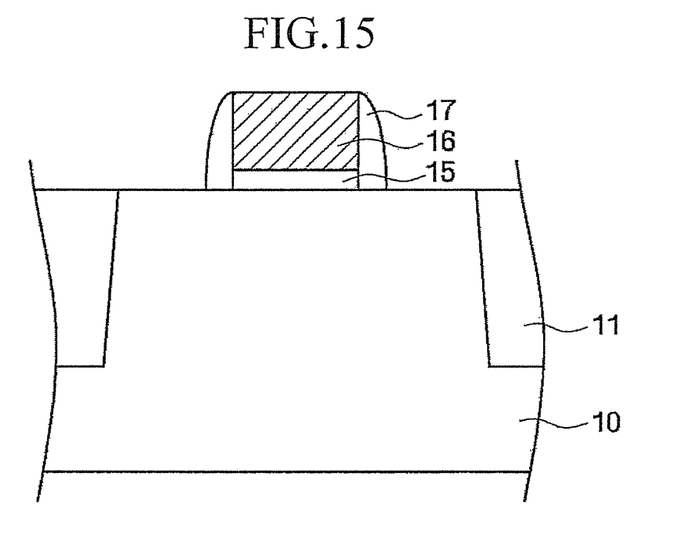
FIGS. 15 to 23 are cross-sectional views illustrating a method of fabricating a semiconductor device according to an example embodiment.

Referring to FIG. 15, a device isolation region 11 is formed in the substrate 10 to define an active region. A dummy gate insulation layer pattern 15 and a dummy gate pattern 16 are formed on the active region of the substrate 10 having the device isolation region 11. Subsequently, a spacer 17 is formed on sidewalls of the dummy gate insulation layer pattern 15 and the dummy gate pattern 16.

Figure 16:
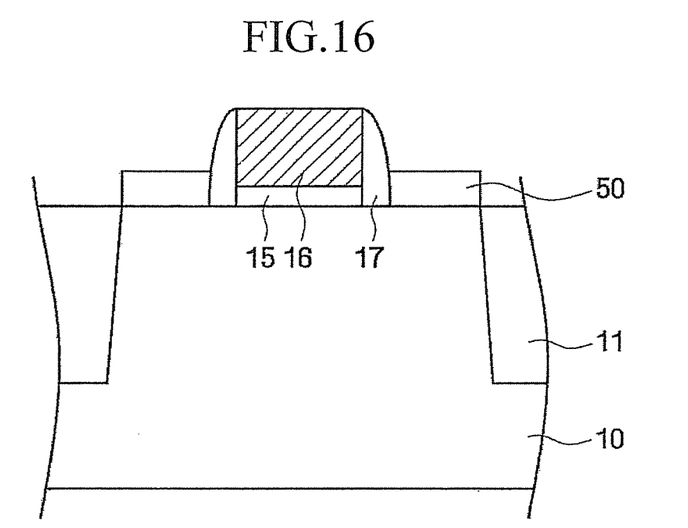

Referring to FIG. 16, selective epitaxial growth is performed on the substrate 10 to form an epitaxial layer 50 elevated on the exposed substrate 10. The selective epitaxial growth may be performed by chemical vapor deposition (CVD), reduced pressure chemical vapor deposition (RPCVD), or ultra high vacuum chemical vapor deposition (UHVCVD), but not limited thereto.

The selective epitaxial growth is performed by supplying a source gas. Here, usable examples of the source gas may include silane (SiH4), dichlorosilane (DCS) (SiH2Cl2), trichlorosilane (TCS) (SiHCl3), but not limited thereto. In addition, when the selective epitaxial growth is performed, not only the source gas but a chlorine (Cl) atom containing gas, such as HCl or Cl2 may be supplied. The supplying of the chlorine (Cl) atom containing gas during selective epitaxial growth may increase selectivity to the substrate 10 compared to an oxide layer or a nitride layer.

Figure 17:
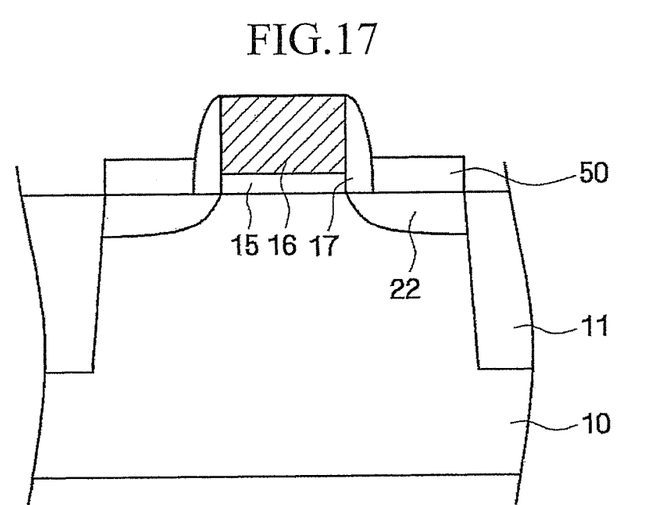

Referring to FIG. 17, impurity ion implantation is performed on the substrate to form an elevated source/drain region 22. The source/drain region 22 is formed in the elevated epitaxial layer 50 and the substrate 10.

Figure 18:
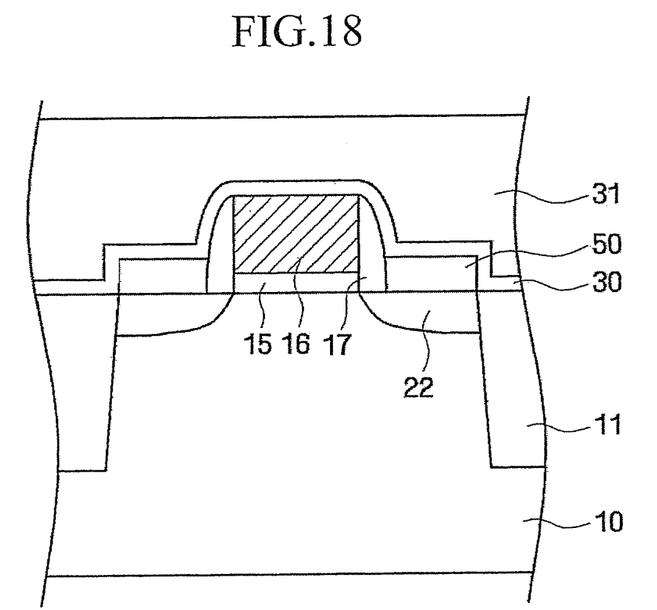

Referring to FIG. 18, an etch stopper film 30 is formed on the entire surface of the substrate 10 having the dummy gate insulation layer pattern 15, the dummy gate pattern 16, the spacer 17 and the epitaxial layer 50 Next, an interlayer dielectric film 31 covering the dummy gate pattern 16 is formed on the etch stopper film 30.

Figure 19:
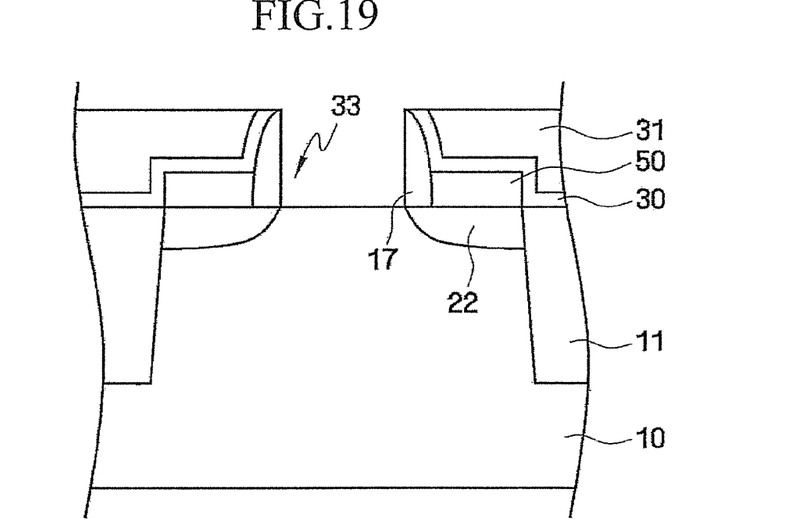

Referring to FIG. 19, a planarizing process is performed until a top surface of the dummy gate pattern 16 is exposed (details of the planarizing process are not shown in FIG. 19, but refer to FIG. 5 for details of the planarizing process in another embodiment). Next, a first gate forming trench 33 is formed by selectively removing the dummy gate pattern 16 and the dummy gate insulation layer pattern 15. According to an alternative embodiment, the dummy gate insulation pattern 15 is not removed when the dummy gate pattern 16 is removed.

Figure 20:
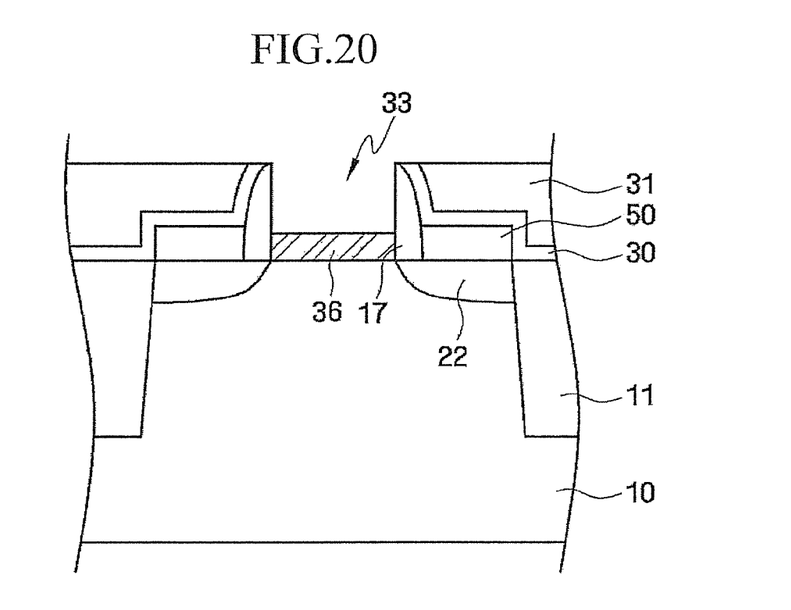

Referring to FIG. 20, a sacrificial layer filling the first gate forming trench 33 is formed on the entire surface of the substrate 10 (details of forming the sacrificial layer are not shown in FIG. 20, but refer to FIG. 7 for an illustration of forming a sacrificial layer 35 in an another example embodiment), and a portion of the sacrificial layer is etched to form a sacrificial layer pattern 36 exposing a top portion of the first gate forming trench 33. A height of the top surface of the sacrificial layer pattern 36 is preferably positioned to be closer to the substrate 10 as long as the top surface of the sacrificial layer pattern 36 is high enough to protect a region of the substrate 10 having a channel formed while a process for extending (or increasing) the top portion of the first gate forming trench 33 shown in FIG. 21 is performed.

Figure 21:
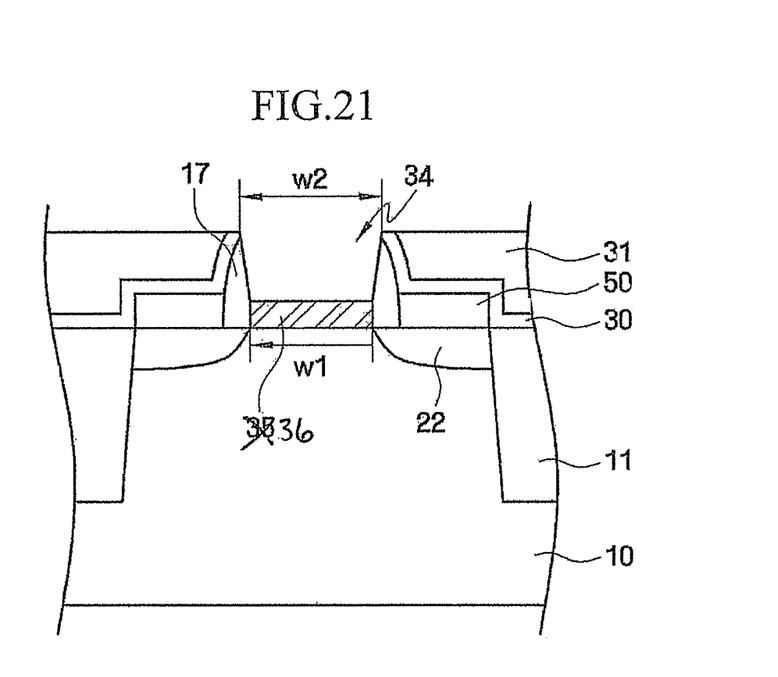

Referring to FIG. 21, a second gate forming trench 34 is formed by extending (or increasing) a width of the top portion of the first gate forming trench 33 using an etching process. The sidewall of the second gate forming trench 34 having an extended top portion may have a sloping profile from the topmost portion to a portion where the sacrificial layer pattern 36 is formed. A width w2 of the topmost portion of the second gate forming trench 34 is greater than a width w1 of the bottommost portion of the second gate forming trench 34. The width of the first gate forming trench 33 is extended, starting from the width above the top surface of the sacrificial layer pattern 36 to the width of the top portion of the first gate forming trench 33, thereby easily controlling the portion of the second gate forming trench 34 where the width thereof starts to extend, and protecting a region in which the channel is to be formed in the substrate 10.

Figure 22:
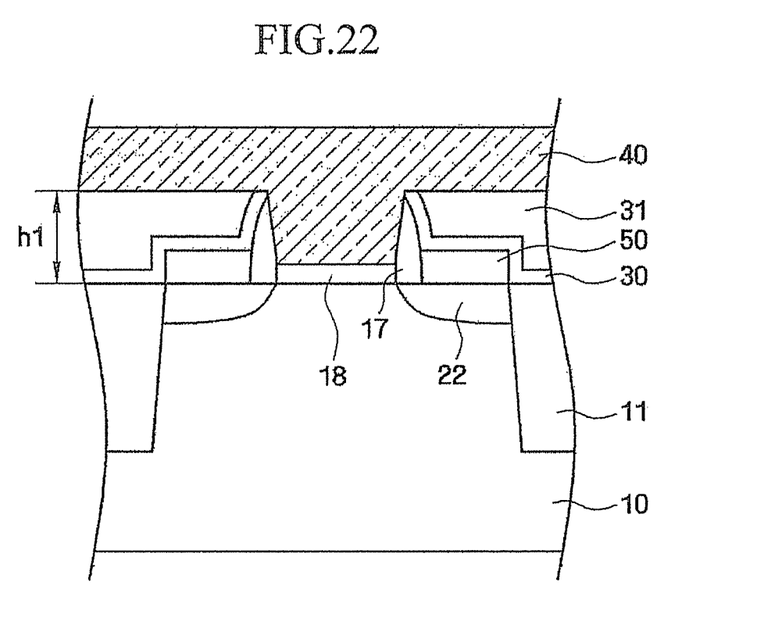

Referring to FIG. 22, the sacrificial layer pattern 36 remaining in the second gate forming trench 34 is removed, and a gate insulation layer 18 is formed in the second gate forming trench 34. Next, a gate forming metal film 40 is formed in the second gate forming trench 34 on the gate insulation layer 18 to fill the second gate forming trench 34 with a metal, and the gate forming metal film 40 is also formed on the interlayer dielectric film 31.

Figure 23:
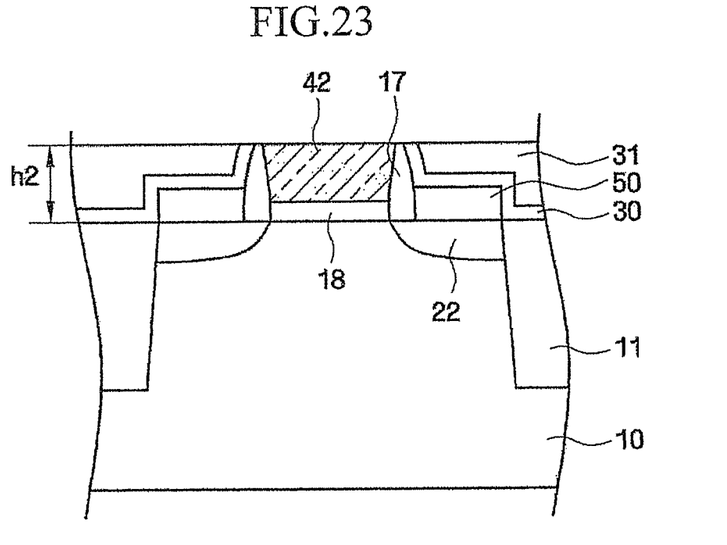

Referring to FIG. 23, the portion of the gate forming metal film 40 formed on the interlayer dielectric film 31 is removed, followed by performing the planarizing process to reduce the height of the second gate forming trench 34. Referring to FIGS. 22 and 23, the height of the second gate forming trench 34 before the planarizing process is h1, and the height of the second gate forming trench 34 after the planarizing process is h2. Here, the planarizing process may be performed such that h2 is smaller than h1 Thereby, the gate pattern 42 is formed in the second gate fanning trench 34.

Although FIG. 22-23 discuss forming a gate forming metal film 40 in the second gate forming trench 34, example embodiments are not limited thereto. For example, in an alternative embodiment, the gate forming trench 34 may be filled by a first sub gate forming metal film 41 and by a second sub gate forming metal film 43, as described in the example embodiment illustrated in FIGS. 13-14.

Figure 24:
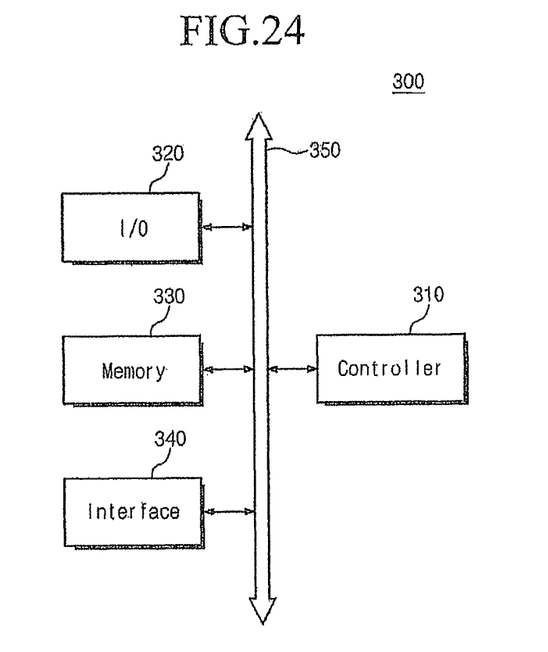
FIG. 24 is a schematic block diagram of an memory system including a semiconductor device manufactured by fabricating methods according to some example embodiments.

FIG. 24 is a schematic block diagram of a memory system including a semiconductor device manufactured by fabricating methods according to example embodiments.

Semiconductor devices according to some example embodiments may be implemented in logic devices that perform operations on logic data. Alternatively, semiconductor devices according to other example embodiments may be implemented by memory devices that store data. In the latter case, a data storage element that stores data may be formed on a contact plug. The data storage element may be a capacitor or a variable resistor.

Referring to FIG. 24, a memory system 300 may be applied a personal digital assistant (PDA), a portable computer, a web tablet, a wireless phone, a mobile phone, a digital music player, a memory card, or all other devices capable of transmitting and/or receiving information in wireless environments.

The memory system 300 may include a controller 310, an input/output device (I/O) 320 such as a keypad, a keyboard, a display, or the like, a memory 330, an interface 340, and a bus 350. The memory 330 and the interface 340 communicate with each other through the bus 350.

The controller 310 includes logic devices implemented according to some example embodiments. The logic devices may perform operations on logic data. In detail, the controller 310 may include at least one microprocessor, a digital signal processor, a microcontroller, or other similar processors. In detail, the memory 330 may be used to store commands executed by the controller 310. The input/output device 320 may receive/transmit data or a signal from/to the outside of the memory system 300. The input/output device 320 may include, for example, a keypad, a keyboard, a display, or the like. The memory 330 may include memory devices implemented according to some example embodiments.

The memory 330 may further include other types of memories, arbitrarily accessible volatile memories, or other various types of memories. The interface 340 may transmit/receive data to/from a communication network.

While example embodiments have been particularly shown and described, it will be understood by those of ordinary skill in the art that various changes in form and details may be made therein without departing from the spirit and scope of the claims.

What is claimed is:

1. A method of fabricating a semiconductor device comprising:
   forming a dummy gate pattern on a substrate;
   forming an interlayer dielectric film that covers the dummy gate pattern;
   exposing a top surface of the dummy gate pattern;
   selectively removing the dummy gate pattern to form a first gate trench;
   forming a sacrificial layer pattern over a top surface of the substrate in the first gate trench, the sacrificial layer pattern leaving a top portion of the first gate trench exposed;
   increasing an upper width of the exposed top portion of the first gate trench to form a second gate trench;
   removing the sacrificial layer pattern in the second gate trench;
   after removing the sacrificial layer pattern in the second gate trench, forming a gate insulation layer in the second gate trench; and
   forming a non-dummy gate pattern in the second gate trench.

2. The method of claim 1, wherein at least a portion of the non-dummy gate pattern includes a metal, and
   wherein the forming a non-dummy gate pattern comprises:
      forming a metal film on the substrate and the interlayer dielectric layer, the metal film filling the second gate trench;
      removing the metal film on the interlayer dielectric film; and
      reducing a height of the second gate trench.

3. The method of claim 1, wherein a width of a topmost portion of the second gate trench is greater than a width of a bottommost portion of the second gate trench.

4. The method of claim 1, wherein
   prior to forming the non-dummy gate pattern, a sidewall defined by the second gate trench has (1) a vertical profile from the bottommost portion of the second gate trench to a first height in the second grate trench and (2) an upwardly sloping profile in which the width of the second gate trench increases from the first height to a topmost portion of the second gate trench.

5. The method of claim 1, wherein a top surface of the sacrificial layer pattern is lower than a top surface of the interlayer dielectric film.

6. The method of claim 5, wherein the sacrificial layer pattern includes at least one of an organic layer and an oxide layer.

7. The method of claim 6, wherein the organic layer includes a spin on hard mask (SOH).

8. The method of claim 6, wherein the oxide layer includes a layer selected from the group consisting of tonen silazene (TOSZ) layer, a spin on glass (SOG) layer, a flowable-chemical vapor deposition (F-CVD) layer, or an undoped silica glass (USG) layer.

9. The method of claim 6, wherein the forming the sacrificial layer pattern comprises:
   forming a sacrificial layer that fills the first gate trench and covers the substrate; and
   removing a portion of the sacrificial layer in the first gate trench.

10. The method of claim 1, wherein before the forming the interlayer dielectric film that covers the dummy gate pattern, the method further comprises:

forming a spacer on sidewalls defined by the dummy gate pattern; and forming an elevated epitaxial layer above the substrate.

11. The method of claim 10, further comprising:

forming source/drain regions in the elevated epitaxial layer and the substrate.

12. The method of claim 1, wherein before the forming the interlayer dielectric film that covers the dummy gate pattern, the method further comprises:

forming an etch stopper film (1) over the substrate and (2) over the dummy gate pattern.

13. A method of fabricating a semiconductor device, the method comprising:

forming a dummy gate pattern on a substrate;

forming an interlayer dielectric film that covers the dummy gate pattern;

forming a first gate forming trench in the interlayer dielectric film by selectively removing the dummy gate pattern, the first gate trench defining inner walls;

forming a sacrificial layer pattern on a top surface of the substrate in the first gate trench while exposing a top portion of the first gate trench, the sacrificial layer pattern does not contact a portion of the inner walls of the first gate trench;

forming a second gate trench by etching the portion of the inner wall of the first gate trench that does not contact the sacrificial layer pattern, the second gate trench (1) having a topmost width greater than a bottommost width and (2) defining an inner wall that includes (i) a portion not in contact with the sacrificial layer pattern and (ii) a portion in contact with the sacrificial layer pattern;

removing the sacrificial layer pattern in the second gate trench; and forming a non-dummy gate pattern in the second gate trench.

14. The method of claim 13, wherein before the removing the sacrificial layer pattern, the inner wall portion of the second gate trench not in contact with the sacrificial layer pattern has a sloping profile in which the width of the second gate trench increases upwardly.

15. The method of claim 14, wherein before the removing the sacrificial layer pattern, the inner wall portion of the second gate trench in contact with the sacrificial layer pattern has a vertical profile.

16. A method of fabricating a semiconductor device, the method comprising:

forming a dielectric layer above a substrate;

forming a first gate trench in the dielectric layer, the first gate trench having sidewalls;

forming a sacrificial pattern layer in the first gate trench, the sacrificial pattern layer having an upper surface that is below an upper surface of the dielectric layer;

after forming the sacrificial pattern layer in the first gate trench, increasing a width of at least a portion of the first gate trench to form a second gate trench such that a width of at least a portion of second gate trench decreases from the upper surface of the dielectric layer;

removing the sacrificial pattern layer;

after removing the sacrificial pattern layer, forming a gate insulation layer in the second gate trench; and forming a first gate metal film in the second gate trench.

17. The method of claim 16, wherein the forming the dielectric layer above the substrate comprises:

forming a dummy gate pattern layer over the substrate;

forming a spacer layer over sidewalls defined by the dummy gate pattern layer; and forming an interlayer dielectric layer above the spacer layer.

18. The method of claim 17, wherein the increasing the width of at least the portion of the first gate trench to form the second gate trench is performed by a wet etching or a dry etching process that removes portions of the spacer layer.

19. The method of claim 16, wherein a sidewall defining the second gate trench has a tapered profile from the upper surface of the dielectric layer to a first height in the second gate trench, and has a vertical profile below the first height.

* * * * *